United States Patent
Ko et al.

(10) Patent No.: US 7,146,284 B2
(45) Date of Patent: Dec. 5, 2006

(54) METHOD OF TESTING PHASE LOCK LOOP STATUS DURING A SERIALIZER/DESERIALIZER INTERNAL LOOPBACK BUILT-IN SELF-TEST

(75) Inventors: Jesse Jonghyuk Ko, Dallas, TX (US); Shaun Lytollis, Silverstone (GB)

(73) Assignee: Texas Instruments Incorporated, Dallas, TX (US)

( * ) Notice: Subject to any disclaimer, the term of this patent is extended or adjusted under 35 U.S.C. 154(b) by 535 days.

(21) Appl. No.: 10/704,288

(22) Filed: Nov. 7, 2003

(65) Prior Publication Data

US 2005/0102593 A1 May 12, 2005

(51) Int. Cl.
*G06F 19/00* (2006.01)

(52) U.S. Cl. ...................... 702/117; 702/108
(58) Field of Classification Search ............... 702/108, 702/117
See application file for complete search history.

(56) References Cited

U.S. PATENT DOCUMENTS 6,201,829 B1 * 3/2001 Schneider .................. 375/221
6,834,367 B1 * 12/2004 Bonneau et al. ............ 714/738

OTHER PUBLICATIONS

Newell, J.C.; "High speed pseudo-random binary sequence generation for testing and data scrambling in gigabit optical transmission systems"; IEE Colloquium on Gigabit Logic Circuits; Apr. 3, 1992; pp. 1/1-1/4.*
Hetherington, G; Simpson, R; "Circular Bist Testing The Digital Logic With A High Speed Serdes"; Proceedings International Test Conference, 2003; vol. 1; Sep. 30-Oct. 2, 2003; pp. 1221-1228.*

* cited by examiner

*Primary Examiner*—John Barlow
*Assistant Examiner*—Douglas N Washburn
(74) *Attorney, Agent, or Firm*—Alan K. Stewart; W. James Brady; Frederick J. Telecky, Jr.

(57) ABSTRACT

System and method are implemented to allow phase lock loop (PLL) status testing during a Serializer/Deserializer (SERDES) internal loopback built-in self-test (BIST). An existing pseudo random binary sequence (PRBS) data generator is modified to include a mode that produces a data pattern having a frequency content low enough to be verified on the tester used at the probe.

17 Claims, 1 Drawing Sheet

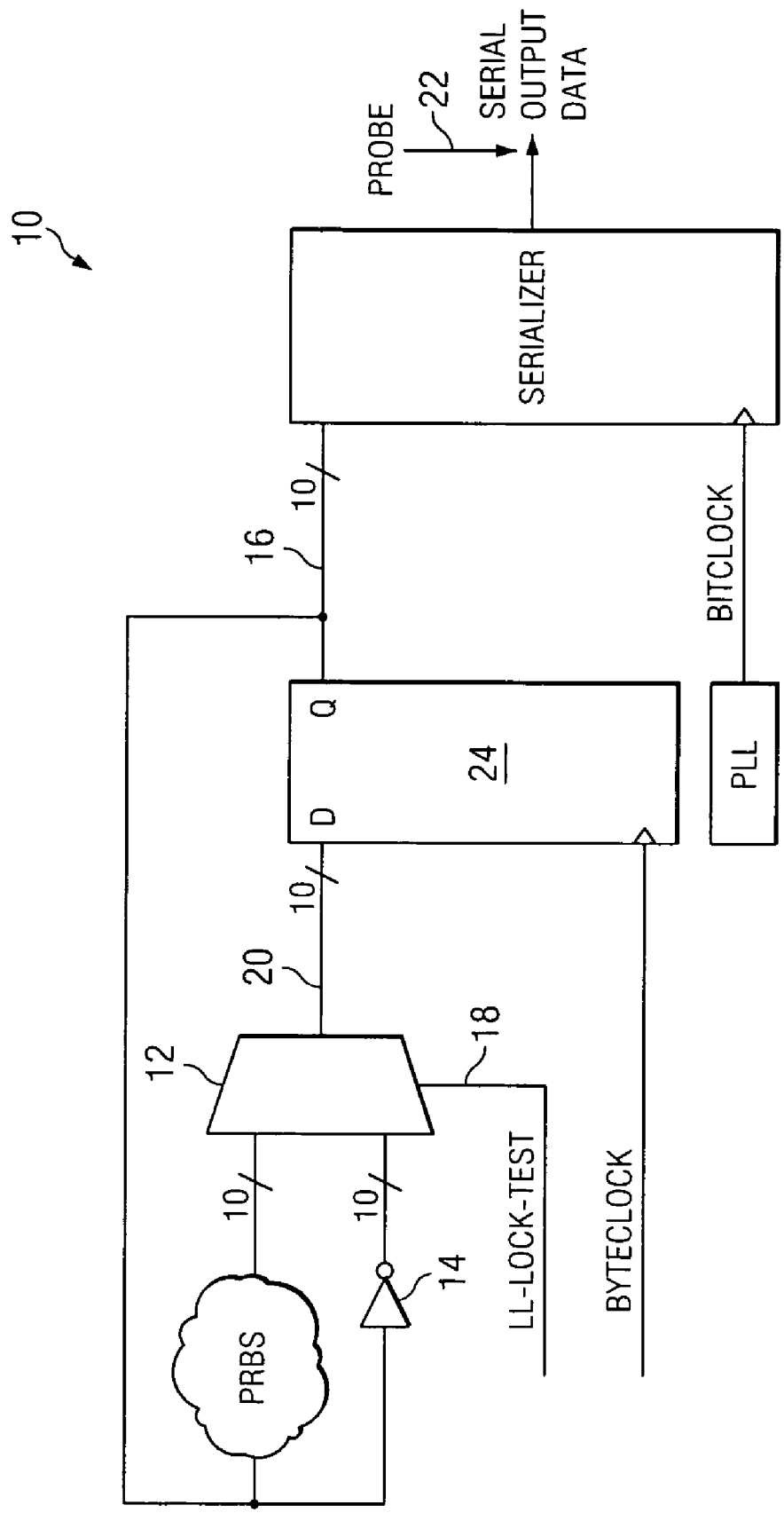

METHOD OF TESTING PHASE LOCK LOOP STATUS DURING A SERIALIZER/DESERIALIZER INTERNAL LOOPBACK BUILT-IN SELF-TEST

BACKGROUND OF THE INVENTION

1. Field of the Invention

This invention relates generally to built-in self-testing (BIST), and more particularly to a technique for testing phase lock loop (PLL) status during a Serializer/Deserializer (SERDES) internal loopback BIST.

2. Description of the Prior Art

Existing internal loopback built-in self-tests (BISTs) on a SerializerDeserializer (SERDES) are unable to verify the lock status of a PLL at the probe at the PLL operating frequency due to the speed limitations associated with the tester and the BIST architecture. Although the PLL lock status can be verified at final test by using external loopback test methodology, such verification is possible only if the customer design has the same number of transmitters and receivers on the same chip. In cases where a product has only a transmitter or receiver therefore, it becomes a serious test escape issue. Even for products having the same number of transmitters and receivers, it remains a test escape issue at the probe, resulting in assembly of faulty dies.

In view of the foregoing, it would be both beneficial and advantageous to provide a technique for allowing phase lock loop (PLL) status testing during SERDES internal loopback BIST.

SUMMARY OF THE INVENTION

To meet the above and other objectives, the present invention provides a technique for allowing phase lock loop (PLL) status testing during a Serializer/Deserializer (SERDES) internal loopback BIST. An existing pseudo random binary sequence (PRBS) data generator is modified to include a mode that produces a data pattern having a frequency content low enough to be verified on the tester used at the probe.

According to one embodiment, a test system comprises a plurality of flip-flops configured in parallel to generate a plurality of binary output signals in response to a byte clock and further in response to a plurality of multiplexer (MUX) output signals; a plurality of multiplexers (MUXs) configured in parallel to generate the plurality of MUX output signals in response to a PLL lock mode signal and further in response to a plurality of inverter signals; a plurality of inverters configured in parallel to generate the plurality of inverter signals in response to the plurality of binary output signals; and a serializer operational to generate a low frequency serial output signal in response to a bit clock and further in response to the plurality of binary output signals, such that the low frequency serial output signal produces a data pattern having a frequency content low enough to be verified via a desired data probe.

According to another embodiment, a test system has a pseudo random binary sequence (PRBS) generator system configured to include a mode that produces a data pattern having a frequency content low enough to be verified on the test system via a desired test probe.

According to yet another embodiment, a test system comprises means for generating a plurality of binary output signals in response to a byte clock and further in response to a plurality of multiplexer (MUX) output signals; means for generating the plurality of MUX output signals in response to a PLL lock mode signal and further in response to a plurality of inverter signals; means for generating the plurality of inverter signals in response to the plurality of binary output signals; and means for generating a low frequency serial output signal in response to a bit clock and further in response to the plurality of binary output signals, such that the low frequency serial output signal produces a data pattern having a frequency content low enough to be verified via a desired data probe.

According to still another embodiment, a method of generating a low frequency serial output signal comprises the steps of providing a test system having a pseudo random binary sequence (PRBS) generator system; and configuring the PRBS generator system to include a mode that produces a data pattern having a frequency content low enough such that a phase lock loop lock can be verified on the test system via a desired test probe.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing FIGURE thereof and wherein:

The FIGURE is a schematic diagram illustrating a PRBS generator modified to include a mode which produces a data pattern with a frequency content low enough to be verified on the test used at the probe according to one embodiment of the present invention.

While the above-identified drawing FIGURE sets forth a particular embodiment other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The FIGURE is a schematic diagram illustrating a PRBS generator 10 modified to include a mode which produces a data pattern with a frequency content low enough to be verified on the test used at the probe according to one embodiment of the present invention. Modified PRBS generator 10 employs existing BIST features with only slight modifications, and therefore does not require any additional package pins during use. Those skilled in the BIST art will also appreciate that modified PRBS generator 10 further does not require upgrades to existing testers.

As stated herein before, existing internal loopback built-in self-testing associated with a SERDES cannot verify the lock status of a PLL at the test probe at the PLL operating frequency due to tester speed limitations and BIST architecture. The BIST architecture has been modified by the present inventors to include a modified PRBS generator 10 as shown in the FIGURE, to allow verification of PLL lock status during internal loopback BIST.

With continued reference now to the FIGURE, a plurality of multiplexers (MUX's) 12 and inverters 14 have been added to the BIST architecture in order to implement a modified PRBS generator 10. The FIGURE depicts 10 MUX's 12 and 10 inverters 14 in parallel across all 10 bits of the output word 16. The present invention is not so limited however, and it shall be understood that other combinations of MUX's and inverters can just as easily be configured to implement the modified PRBS generator 10, so long as the desired low frequency is generated according to the principles set forth herein.

A particular embodiment of one original PRBS function was found by the present inventors to have two mode controls for selecting a desired PRBS sequence (e.g. PRBS7, PRBS23, etc.). A new mode control, PLL_LOCK_TEST 18, was added to select a new mode. When mode control 18 is "ON", then the MUX's 12 bypass the PRBS function; and all 10 outputs 20 simply toggle via the inverters 14. One sequence found suitable for use by the present inventors can be represented as 11111111110000000000111111111110000000000, and so on. This sequence produces the desired low frequency that can then be measured at the probe 22. The flops 24 are held in reset when the generator is disabled; so it always starts from the 0000000000 state.

It can be appreciated that the actual output frequency will depend on the PLL multiply ratio selected (via a tester configuration register, for example CFG[2:0]), and the word size and data rate controls (also via tester configuration registers, for example CFG[6:4]). Looking again at the FIGURE, the Bit clock to the Serializer can be seen to be generated by the phase lock loop output. Since there are 10 ones and 10 zeros in the data stream, created by adding the MUXs 12 and the inverters 14, the output of the SERDES system 10 will toggle at 10 times slower speed compared to the original output of the PLL Bit clock. Using an appropriate combination of word size and data rate control, the SERDES system 10 output can be controlled to generate clock patterns at less than 200 MHz for all PLL multiply ratios. The present inventors found it possible to generate an output frequency below 200 MHz for all the desired multiply ratios (using half/quarter rate modes, and the like); therefore making it possible to check that the PLL locks at all multiply ratios and bandwidth settings.

In view of the above, it can be seen the present invention presents a significant advancement in the art of BIST techniques. Further, this invention has been described in considerable detail in order to provide those skilled in the art of testing PLL lock status during SERDES internal loopback BIST with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A test system comprising:
   a plurality of flip-flops configured in parallel to generate a plurality of binary output signals in response to a byte clock and further in response to a plurality of multiplexer (MUX) output signals;
   a plurality of multiplexers (MUXs) configured in parallel to generate the plurality of MUX output signals in response to a PLL lock mode signal and further in response to a plurality of inverter signals;
   a plurality of inverters configured in parallel to generate the plurality of inverter signals in response to the plurality of binary output signals; and
   a serializer operational to generate a low frequency serial output signal in response to a bit clock and further in response to the plurality of binary output signals, such that the low frequency serial output signal produces a data pattern having a frequency content low enough to be verified via a desired data probe.

2. The test system according to claim 1, wherein the plurality of flip-flops comprise D-type flip-flops.

3. The test system according to claim 1, wherein the plurality of flip-flops are further configured to be held in reset mode until the test system is activated such that the plurality of binary output signals always commence from a zero sequence state.

4. The test system according to claim 1, further comprising a pseudo random binary sequence (PRBS) generator, wherein the PRBS generator is configured to be selectively bypassed when the plurality of MUXs are responsive to the inverter signals.

5. The test system according to claim 1, wherein the low frequency serial output signal frequency is further dependent upon a phase lock loop (PLL) multiply ratio, word size data, and rate data.

6. A test system having a pseudo random binary sequence (PRBS) generator system configured to include a mode that produces a data pattern having a frequency content low enough to be verified on the test system via a desired test probe, wherein the PRBS generator system comprises:
   a plurality of flip-flops configured in parallel to generate a plurality of binary output signals in response to a byte clock and further in response to a plurality of multiplexer (MUX) output signals;
   a plurality of multiplexers (MUXs) configured in parallel to generate the plurality of MUX output signals in response to a PLL lock mode signal and further in response to a plurality of inverter signals; and
   a plurality of inverters configured in parallel to generate the plurality of inverter signals in response to the plurality of binary output signals;
   wherein the PRBS generator system further comprises a serializer operational to generate a low frequency serial output signal in response to a bit clock and further in response to the plurality of binary output signals, such that the low frequency serial output signal produces the data pattern having a frequency content low enough to be verified via the desired data probe.

7. The test system according to claim 6, wherein the PRBS generator system further comprises a PRBS generator configured to be selectively bypassed when the plurality of MUXs are responsive to the inverter signals.

8. A test system comprising:
   means for generating a plurality of binary output signals in response to a byte clock and further in response to a plurality of multiplexer (MUX) output signals;
   means for generating the plurality of MUX output signals in response to a PLL lock mode signal and further in response to a plurality of inverter signals;
   means for generating the plurality of inverter signals in response to the plurality of binary output signals; and
   means for generating a low frequency serial output signal in response to a bit clock and further in response to the plurality of binary output signals, such that the low frequency serial output signal produces a data pattern having a frequency content low enough to be verified via a desired data probe.

9. The test system according to claim 8, wherein the means for generating a plurality of binary output signals comprises a plurality of D-type flip-flops.

10. The test system according to claim 9, wherein the plurality of D-type flip-flops are configured to be held in reset mode until the test system is activated such that the plurality of binary output signals always commence from a zero sequence state.

11. The test system according to claim 8, wherein the means for generating the plurality of MUX output signals comprises a plurality of multiplexers.

12. The test system according to claim 8, wherein the means for generating the plurality of inverter signals comprises a plurality of inverters.

13. The test system according to claim 8, wherein the means for generating a low frequency serial output signal comprises a data serializer.

14. The test system according to claim 8, wherein the low frequency serial output signal frequency is further dependent upon a phase lock loop (PLL) multiply ratio, word size data, and rate data.

15. A method of generating a low frequency serial output signal, the method comprising the steps of:
 providing a test system having a pseudo random binary sequence (PRBS) generator system; and
 configuring the PRBS generator system to include a mode that produces a data pattern having a frequency content low enough such that a phase lock loop lock can be verified on the test system via a desired test probe.

16. The method according to claim 15, wherein the step of configuring the PRBS generator system comprises the steps of:
 activating a parallel switching network to generate an output word;
 deactivating a local PRBS generator during activation of the parallel switching network; and
 serializing the output word to produce the data pattern.

17. The method according to claim 16, wherein the step of activating a parallel switching network comprises the steps of:
 generating the output word in response to a byte clock and further in response to a plurality of multiplexer (MUX) output signals via a plurality of parallel flip-flops;
 generating the plurality of MUX output signals in response to a PLL lock mode signal and further in response to a plurality of inverter signals via a plurality of parallel multiplexers (MUXs);
 generating the plurality of inverter signals in response to the output word via a plurality of parallel inverters.

\* \* \* \* \*